(12) United States Patent
Park et al.

(10) Patent No.: US 9,019,256 B2
(45) Date of Patent: Apr. 28, 2015

(54) SHIFT REGISTER AND DISPLAY APPARATUS THAT ADDRESSES PERFORMANCE PROBLEMS CAUSED BY TRANSISTOR LEAKAGE CURRENT

(75) Inventors: Jin-Woo Park, Yongin (KR); Seung-Kyu Lee, Yongin (KR); Chul-Ho Kim, Yongin (KR); Dong-Hoon Lee, Yongin (KR); Chi-Woo Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 656 days.

(21) Appl. No.: 13/155,779

(22) Filed: Jun. 8, 2011

(65) Prior Publication Data
US 2012/0146978 A1  Jun. 14, 2012

(30) Foreign Application Priority Data

Dec. 13, 2010  (KR) .......................... 10-2010-0127089

(51) Int. Cl.
*G09G 3/36* (2006.01)
*G11C 19/28* (2006.01)

(52) U.S. Cl.
CPC ................................... *G11C 19/287* (2013.01)

(58) Field of Classification Search
CPC ..... G11C 19/287; G11C 27/04; G09G 3/3677; G09G 2310/0286
USPC .......... 345/89–100, 211–213; 377/64; 326/46; 327/108; 315/194–195
See application file for complete search history.

(56) References Cited

U.S. PATENT DOCUMENTS

| | | | |
|---|---|---|---|
| 2006/0220587 A1* | 10/2006 | Tobita et al. .................. | 315/194 |
| 2007/0046327 A1* | 3/2007 | Wei et al. ........................ | 326/46 |
| 2007/0296662 A1 | 12/2007 | Lee et al. | |
| 2008/0012818 A1* | 1/2008 | Lee et al. ........................ | 345/100 |
| 2008/0079676 A1* | 4/2008 | Pak et al. ........................ | 345/87 |
| 2009/0086116 A1 | 4/2009 | Pak | |
| 2010/0026669 A1* | 2/2010 | Lee et al. ........................ | 345/204 |
| 2010/0039363 A1 | 2/2010 | Lee et al. | |
| 2010/0156474 A1* | 6/2010 | Park et al. ...................... | 327/108 |
| 2010/0171728 A1* | 7/2010 | Han et al. ....................... | 345/211 |
| 2010/0177082 A1* | 7/2010 | Joo et al. ........................ | 345/211 |
| 2010/0201666 A1* | 8/2010 | Tobita ............................. | 345/208 |
| 2012/0326955 A1* | 12/2012 | Ohara ............................. | 345/92 |

FOREIGN PATENT DOCUMENTS

| | | |
|---|---|---|
| KR | 10-2008-0006037 | 1/2008 |
| KR | 10-2008-0104726 | 12/2008 |
| KR | 10-2009-0032712 | 4/2009 |
| KR | 10-2010-0021234 | 2/2010 |

* cited by examiner

*Primary Examiner* — Jonathan Boyd
*Assistant Examiner* — James Nokham
(74) *Attorney, Agent, or Firm* — Robert E. Bushnell, Esq.

(57) ABSTRACT

A shift register including a plurality of stages, each of them including a first node, a second node, and a third node being in a high-impedance state when the first node is in a high-impedance state. The shift register includes an input circuit unit inputting a driving voltage to the first node in response to an output signal of a previous stage, a driving circuit unit generating an output signal according to a voltage of the first node, and a holding unit holding the output signal at a level of a gate-off voltage according to a voltage of the second node in an inactive period of a current stage, in which the holding unit comprises a first diode which applies a clock signal to the second node.

21 Claims, 10 Drawing Sheets

SHIFT REGISTER AND DISPLAY APPARATUS THAT ADDRESSES PERFORMANCE PROBLEMS CAUSED BY TRANSISTOR LEAKAGE CURRENT

CROSS REFERENCE TO RELATED APPLICATIONS

This application makes reference to, incorporates the same herein, and claims all benefits accruing under 35 U.S.C §119 from an application entitled earlier filed in the Korean Intellectual Property Office on 13 Dec. 2010, which was duly assigned Serial No. 10-2010-0127089 by that Office.

BACKGROUND OF THE INVENTION

1. Field of the Invention

Embodiments of the present invention relate to a shift register and a display apparatus using the shift register.

2. Description of the Related Art

By a data driving unit, a display apparatus converts input data into a data signal, by a gate driving unit, controls scanning of each pixel to adjust luminance of each pixel, thus displaying an image corresponding to the input data. The data driving unit and the gate driving unit may operate according to a timing determined by a control signal of a timing control unit. The gate driving unit may include a shift register for generating a gate driving signal.

Also, each pixel of a liquid crystal display (LCD) device includes a liquid crystal capacitor, which is connected to a gate line, to be charged with an image data voltage and a storage capacitor, which is connected to the liquid crystal capacitor, to maintain the voltage charged in the liquid crystal capacitor. According to the voltage charged in the liquid crystal capacitor, an image is displayed.

SUMMARY OF THE INVENTION

Embodiments of the present invention intend to effectively remove a ripple of a gate driving signal.

According to an aspect of the present invention, there is provided a shift register with a plurality of stages, each of which includes a first node, a second node, and a third node being in a high-impedance state when the first node is the high-impedance state. The shift register includes an input circuit unit inputting a driving voltage to the first node in response to an output signal of a previous stage, a driving circuit unit generating an output signal according to a voltage of the first node, and a holding unit holding the output signal at a level of a gate-off voltage according to a voltage of the second node in an inactive period of a current stage, in which the holding unit comprises a first diode which applies a clock signal to the second node.

Each of the plurality of stages may include a clock terminal to which the clock signal is input, an inverted clock terminal to which an inverted clock signal of the clock signal is input, and an off-voltage terminal to which the gate-off voltage is input, and the holding unit may include a tenth transistor, the tenth transistor comprising a gate electrode connected to the inverted clock terminal, a first electrode connected to the second node, and a second electrode connected to the off-voltage terminal.

Each of the plurality of stages may include an output terminal which outputs the output signal, and the holding unit may include a fifth transistor comprising a gate electrode connected to the second node, a first electrode connected to the output terminal, and a second electrode connected to the off-voltage terminal, a fourth transistor comprising a gate electrode connected to the second node, a first electrode connected to the third node, and a second electrode connected to the off-voltage terminal, and a seventh transistor comprising a gate electrode connected to the first node, a first electrode connected to the second node, and a second electrode connected to the off-voltage terminal.

The holding unit may further include a first-fourth transistor including a gate electrode connected to the second node, a first electrode connected to the third node, and a second electrode connected to the first node.

Each of the plurality of stages may further include a pull down unit which holds the output signal at the level of the gate-off voltage in a period where the inverted clock signal is active.

The pull down unit may include a sixth transistor including a gate electrode connected to the inverted clock terminal, a first electrode connected to the output terminal, and a second electrode connected to the off-voltage terminal.

The driving circuit unit may include a first transistor including a gate electrode connected to the first node, a first electrode connected to the clock terminal, and a second electrode connected to the output terminal and a boosting capacitor connected between the first node and the output terminal.

The input circuit unit may include a second transistor including a gate electrode connected to an output terminal of a first previous stage, a first electrode connected to an output terminal of a second previous stage, and a second electrode connected to the third node; a first-second transistor including a gate electrode connected to the output terminal of the first previous stage, a first electrode connected to the third node, and a second electrode connected to the first node; a second diode applying the output signal of the current stage to the third node; a third transistor including a gate electrode connected to an output terminal of a second next stage, a first electrode connected to the third node, and a second electrode connected to an output terminal of a first next stage; and a first-third transistor including a gate electrode connected to the output terminal of the second next stage, a first electrode connected to the third node, and a second electrode connected to the first node.

The first previous stage may be a stage preceding the current stage by two stages, the second previous stage may be a stage preceding the current stage by one stage, the first next stage may be a stage following the current stage after one stage, and the second next stage may be a stage following the current stage after two stages.

The holding unit may further include at least one diode which is serially connected with the first diode between the clock terminal and the second node.

The first diode may be a diode-connected transistor.

The shift register may be driven using first and second clock signals, and first and second inverted clock signals, and (4a+1)th stages may include the clock terminal to which the first clock signal is input and the inverted clock terminal to which the first inverted clock signal is input, in which a is an integer greater than or equal to 0 and less than n/4; (4a+2)th stages may include the clock terminal to which the second clock signal is input and the inverted clock terminal to which the second inverted clock signal is input; (4a+3)th stages may include the clock terminal to which the first inverted clock signal is input and the inverted clock terminal to which the first clock signal is input; and (4a+4)th stages may include the clock terminal to which the second inverted clock signal is input and the inverted clock terminal to which the second clock signal is input.

According to another aspect of the present invention, there is provided a display apparatus including a plurality of pixels disposed at intersecting portions between data lines and gate lines, a gate driving unit outputting gate driving signals to the plurality of pixels, respectively, through the gate lines, and a data driving unit generating a data signal corresponding to an input image and outputting the data signal to the plurality of pixels, respectively, through the data lines, in which the gate driving unit includes a shift register including a plurality of stages which generate and output the gate driving signal, each of the plurality of stages including a first node, a second node, and a third node being in a high-impedance state when the first node is in a high-impedance state. The shift register includes an input circuit unit inputting a driving voltage to the first node in response to an output signal of a previous stage, a driving circuit unit generating an output signal according to a voltage of the first node, and a holding unit holding the output signal at a level of a gate-off voltage according to a voltage of the second node in an inactive period of a current stage, in which the holding unit includes a first diode which applies a clock signal to the second node.

The shift register may include amorphous silicon. An active layer of the transistors included in the shift register may include oxide semiconductor.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Advantages and features of the present invention and a method of achieving the advantages and the features will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art and the present invention is defined only by the appended claims. The following description and annexed drawings are provided to understand operations according to the present invention, and parts that can be easily implemented by those of ordinary skill in the art may be omitted.

It will be understood that when an element is referred to as being "on," "connected to" or "coupled to" another element, it may be directly on, connected or coupled to the other element or intervening elements may be present.

In contrast, when an element is referred to as being "directly on," "directly connected to" or "directly coupled to" another element, there are no intervening elements present. Like reference numerals refer to like elements throughout. As used herein, the term "and/or" includes any and all combinations of one or more of the associated listed items.

It will be understood that, although the terms 'first', 'second', etc., may be used herein to describe various elements, components, and/or sections, these elements, components, and/or sections should not be limited by these terms. These terms are only used to distinguish one element, component, or section from another element, component or section. Thus, a first element, component, or section discussed below could be termed a second element, component, or section without departing from the teachings of exemplary embodiments.

The terminology used herein is for the purpose of describing embodiments only and is not intended to be limiting of exemplary embodiments. As used herein, the singular forms are intended to include the plural forms as well, unless the context clearly indicates otherwise. It will be further understood that the terms "comprises" and/or "comprising" when used in this specification, specify the presence of stated component, step, operation, and/or element, but do not preclude the presence or addition of one or more other components, steps, operations, and/or elements.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be described with reference to the accompanying drawings.

Figure 1:
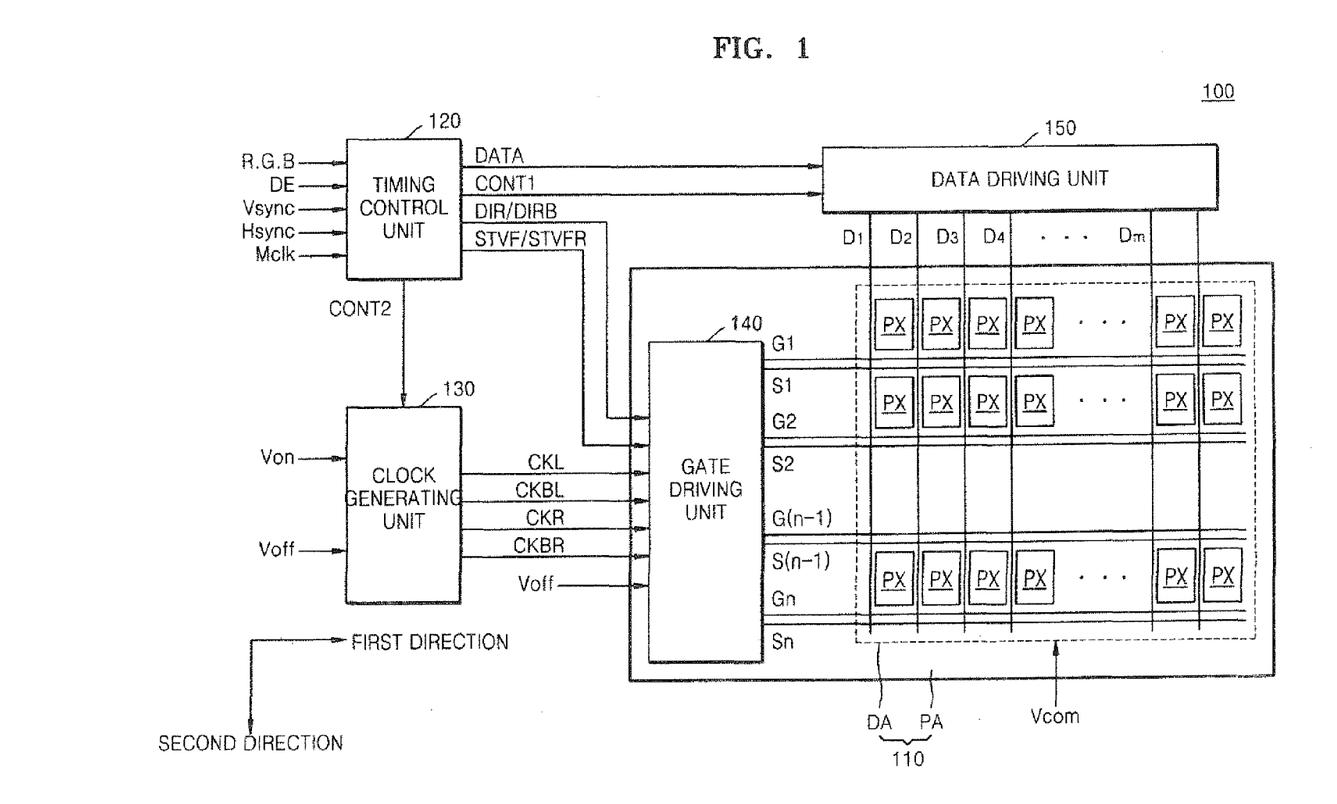
FIG. 1 is a schematic diagram illustrating a structure of a display apparatus according to an embodiment of the present invention.

FIG. 1 is a diagram illustrating a schematic structure of a display apparatus 100 according to an embodiment of the present invention. The display apparatus 100 may be implemented with various types of display apparatuses such as a Liquid Crystal Display (LCD), an organic electro-luminescent display apparatus, a plasma display panel, a field emission display, and so forth. The following description of the embodiments of the present invention will be provided where the display apparatus 100 is implemented with an LCD. However, the present invention is not limited to this example, and a gate driving circuit according to the embodiments of the present invention can be applied to various types of display apparatuses.

The display apparatus 100 according to the current embodiment of the present invention includes a liquid crystal panel 110, a timing control unit 120, a clock generating unit 130, a gate driving unit 140, a data driving unit 150 and pixels PX.

The liquid crystal panel 110 may be divided into a display area DA where an image is displayed and a non-display area PA where an image is not displayed.

Figure 2:
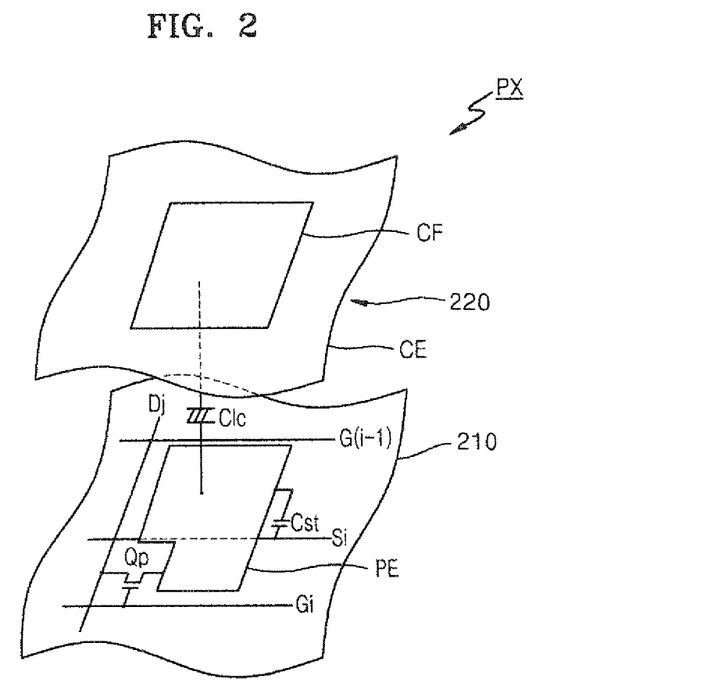
FIG. 2 is a schematic diagram illustrating a structure of a pixel according to an embodiment of the present invention.

The display area DA includes, with reference to FIG. 2, a first substrate 210 where first through nth gate lines G1 through Gn, first through nth storage lines S1 through Sn, first through mth data lines D1 through Dm, a pixel switching element Qp in each pixel PX, and a pixel electrode PE in each pixel PX are formed, a second substrate 220 where a color filter CF and a common electrode CE are formed, and a liquid crystal layer (not shown) interposed between the first substrate 210 and the second substrate 220. The n gate lines G1 through Gn (n is a natural number) extend in a first direction in parallel with one another, and the storage lines S1 through Sn extend in the first direction to correspond to the gate lines G1 through Gn. The data lines D1 through Dm extend in a second direction in parallel with one another. However, the gate lines G1 through Gn and the storage lines S1 through Sn may also extend in the second direction, and the data lines D1 through Dm may extend in the first direction.

FIG. 2 is a schematic diagram illustrating a structure of a pixel PX according to an embodiment of the present invention. Referring to FIG. 2, one of the pixels PX shown in FIG. 1 will be described. For example, a pixel PX connected to an ith gate line Gi (where i is a natural number greater than or equal to 1 and less than n) and a jth data line Dj (where j is a natural number greater than or equal to 1 and less than m) includes the pixel switching element Qp including a gate electrode connected to the gate line Gi, a first electrode connected to the data line Dj, and a second electrode connected to the pixel electrode PE; a liquid crystal capacitor Clc connected to the second electrode of the pixel switching element Qp through the pixel electrode PE, and a storage capacitor Cst.

The liquid crystal capacitor Clc is formed having two electrodes, the pixel electrode PE of the first substrate 210 and the common electrode CE of the second substrate 220, and includes the liquid crystal layer as a dielectric between the two electrodes. A common voltage Vcom (FIG. 1) is applied to the common electrode CE. A light transmittance of the liquid crystal layer (not shown) is adjusted based on a voltage applied to the pixel electrode PE, thus adjusting a luminance of a pixel PX.

The pixel electrode PE may be connected to the data line Dj through the pixel switching element Qp. The pixel switching element Qp is connected to the gate line Gi at a gate electrode thereof, such that upon application of a gate-on voltage Von to the gate line Gi, the pixel switching element Qp applies a data signal delivered through the data line Dj to the pixel electrode PE.

An electrode of the storage capacitor Cst is connected to the liquid crystal capacitor Clc and the other electrode thereof is connected to a storage line Si.

The color filter CF may be formed on the second substrate 220.

The pixel switching element Qp may be a thin film transistor formed of amorphous silicon. For instance, an active layer of the pixel switching element Qp may be formed of oxide semiconductor.

The non-display area PA (FIG. 1) is a portion of the liquid crystal panel 110 where no image is displayed. According to an embodiment of the present invention, the gate driving unit 140 (FIG. 1) may be formed on a region of the first substrate 210.

The timing control unit 120, referring again to FIG. 1, receives an input image signal (R/G/B) and input control signals for controlling the input image signal from an external graphic controller (not shown), generates an image data signal DATA and a data driving unit control signal CONT1, and provides them to the data driving unit 150. The timing control unit 120 receives input control signals, such as a horizontal synchronization signal Hsync, a main clock signal MCKL, a data enable signal DE, and a vertical synchronization signal Vsync, to output the data driving unit control signal CONT1. The data driving unit control signal CONT1 is used to control operations of the data driving unit 150, and includes a horizontal initiation signal for initiating operation of the data driving unit 150 and a load signal for instructing output of a data voltage.

Hence, the image data signal DATA and the data driving unit control signal CONT1 is provided to the data driving unit 150 so as to provide a data signal corresponding to the image data signal DATA to the respective data lines D1 through Dm. The data driving unit 150, which is an Integrated Circuit (IC), may be connected with the liquid crystal panel 110 as a Tape Carrier Package (TCP), or may be formed on the non-display area PA of the liquid crystal panel 110.

The timing control unit 120 provides a clock generation control signal CONT2 to the clock generating unit 130, and provides a first initiation pulse STVF, a second initiation pulse STVFR, a first scan direction control signal DIR and a second scan direction control signal DIRB to the gate driving unit 140. Herein, the clock generation control signal CONT2 may include a gate clock signal for determining an output timing of the gate-on voltage Von and an output enable signal for determining a pulse width of the gate-on voltage Von.

The first and second scan direction control signals DIR and DIRB may control an order of a period where the gate-on voltage Von is applied to each of the gate lines G1 through Gn, that is, an order of a turn-on period. For example, when the first scan direction control signal DIR is high and the second scan direction control signal DIRB is low, the turn-on period is first provided to the first gate line G1 and then the turn-on period is provided sequentially to the second through to the nth gate lines G2 through Gn. Such an operation mode is referred to as a forward scan mode. When the first scan direction control signal DIR is low and the second scan direction control signal DIRB is high, the turn-on period is first provided to the nth gate line Gn and then the turn-on period is provided sequentially to the (n−1)th gate line G(n−1) through to the first gate line G1. Such an operation mode is referred to as a reverse scan mode.

The clock generating unit 130 may output a first clock signal CKL, a first inverted clock signal CKBL, a second clock signal CKR, and a second inverted clock signal CKBR. The first inverted clock signal CKBL may be an inverted signal of the first clock signal CKL or a signal having a delay of ½ a cycle of the first clock signal CKL. The second inverted clock signal CKBR may be an inverted signal of the second clock signal CKR or a signal having a delay of ½ a cycle of the second clock signal CKR. The first clock signal CKL and the second clock signal CKR have 4 horizontal cycles (4H) and the second clock signal CKR may have a delay of 1 horizontal cycle (1H) from the first clock signal CKL.

The gate driving unit 140 provides a corresponding gate driving signal to each of the gate lines G1 through Gn by using the first initiation pulse STVF, the second initiation pulse STVFR, the first scan direction control signal DIR, the second scan direction control signal DIRB, the first clock signal CKL, the second clock signal CKR, the first inverted clock signal CKBL, the second inverted clock signal CKBR, and a gate-off voltage Voff. The gate driving unit 140 may include a shift register for generating a gate driving signal. The gate-off voltage Voff is at a level where transistors included in the shift register 300 (FIG. 3) and the pixel switching element Qp (FIG. 2) included in the pixel PX are turned off. The gate-on voltage Von and the gate-off voltage Voff may be generated by a DC/DC converter.

The structure of the display apparatus 100 described with reference to FIGS. 1 and 2 is an exemplary one, and embodiments of the present invention are not limited to the embodiment shown in FIGS. 1 and 2 and may be implemented in various forms. For example, detailed structures of the pixels PX may be changed variously. In addition, depending on embodiments, the types of signals input to and output from the timing control unit 120, the clock generating unit 130, the gate driving unit 140, and the data driving unit 150 may be changed.

Figure 3:
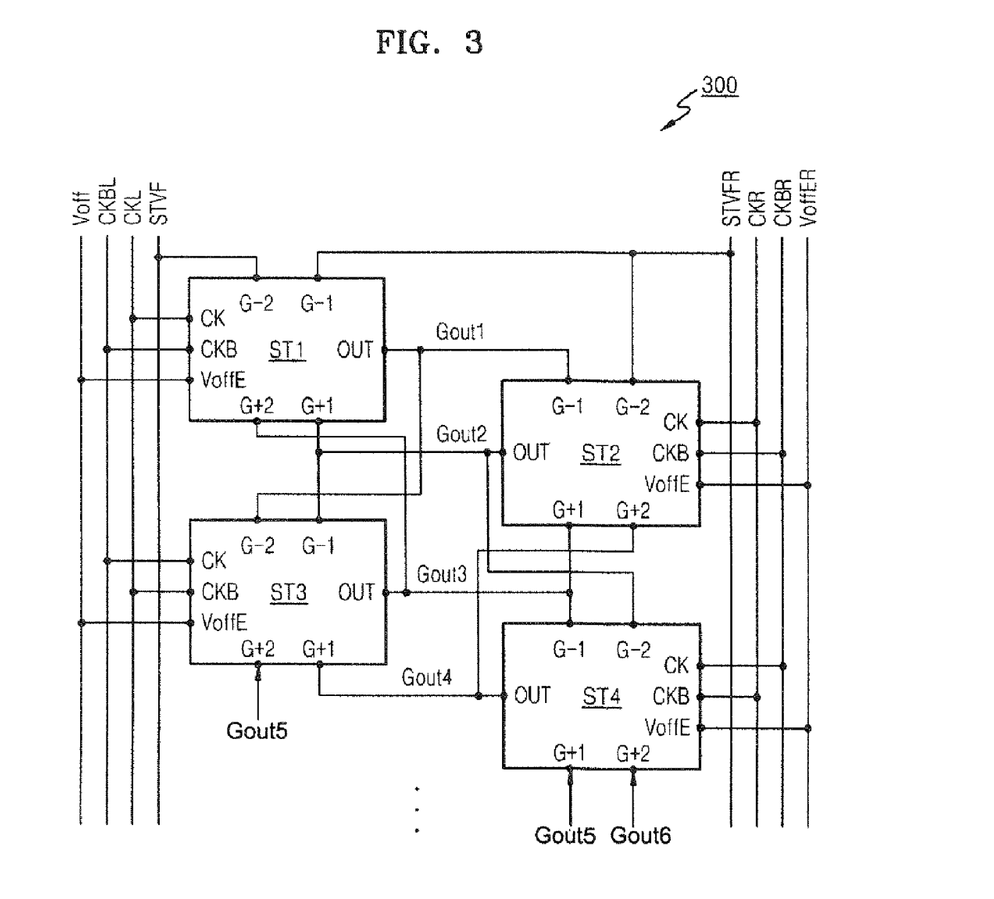
FIG. 3 is a diagram illustrating a structure of a shift register included in a gate driving unit, according to an embodiment of the present invention.

FIG. 3 is a diagram illustrating a structure of a shift register 300 included in the gate driving unit 140, according to an embodiment of the present invention.

The gate driving unit 140 according to an embodiment of the present invention may include the shift register 300 including first through nth stages ST1 through STn. The number of stages may be selected by a designer. As illustrated in FIG. 3, the plurality of stages ST1 through STn may be subordinately connected to lines of the first initiation pulse STVF and the second initiation pulse STVFR. Each stage includes a first input terminal G−2, a second input terminal G−1, a clock terminal CK, an inverted clock terminal CKB, an off-voltage terminal VoffE, a third input terminal G+1, a fourth input terminal G+2, and an output terminal OUT.

The first input terminal G−2 is connected to the first initiation pulse STVF, the second initiation pulse STVFR, or the output terminal OUT of a previous stage preceding the current stage by two stages, and the second input terminal G−1 is connected to the second initiation pulse STVFR or the output terminal OUT of a previous stage preceding the current stage by one stage. The third input terminal G+1 is connected to the output terminal OUT of a next stage following the current stage after one stage, and the fourth input terminal G+2 is connected to the output terminal OUT of a next stage following the current stage after two stages. The off-voltage terminal VoffE is connected to the gate-off voltage Voff line.

The shift register 300 according to embodiments of the present invention uses the first clock signal CKL, the second clock signal CKR, the first inverted clock signal CKBL, and the second inverted clock signal CKBR, and receives different clock signals and inverted clock signals according to different stage positions. For example, as illustrated in FIG. 3, odd-numbered stages ST1, ST3, . . . may receive the first clock signal CKL and the first inverted clock signal CKBL, and even-numbered stages ST2, ST4, . . . may receive the second clock signal CKR and the second inverted clock signal CKBR.

In (4a+1)th stages (where a is an integer greater than or equal to 0 and less than n/4), the first clock signal CKL is input to the clock terminal CK and the first inverted clock signal CKBL is input to the inverted clock terminal CKB. In (4a+3)th stages, the first inverted clock signal CKBL is input to the clock terminal CK and the first clock signal CKL is input to the inverted clock terminal CKB. In (4a+2)th stages, the second clock signal CKR is input to the clock terminal CK and the second inverted clock signal CKBR is input to the inverted clock terminal CKB. In (4a+4)th stages, the second inverted clock signal CKBR is input to the clock terminal CK and the second clock signal CKR is input to the inverted clock terminal CKB.

As shown in FIG. 3, in the first stage ST1, the first initiation pulse STVF is input to the first input terminal G−2 and the second initiation pulse STVFR is input to the second input terminal G−1. In the second stage ST2, the second initiation pulse STVFR is input to the first input terminal G−2, and the second input terminal G−1 is connected to the output terminal OUT of the first stage ST1. The first initiation pulse STVF and the second initiation pulse STVFR may have a gate-on voltage Von period of about 2 horizontal cycles, and the second initiation pulse STVFR may have a delay of 1 horizontal cycle from the first initiation pulse STVF.

Output signals Gout1, Gout2, . . . output from the output terminals OUT of the stages are gate driving signals output to the respective pixels PX through the gate lines G1 through Gn. As another example, the output signals Gout1, Gout2, . . . are storage voltages output to the respective pixels PX through the storage lines S1 through Sn.

Figure 4:
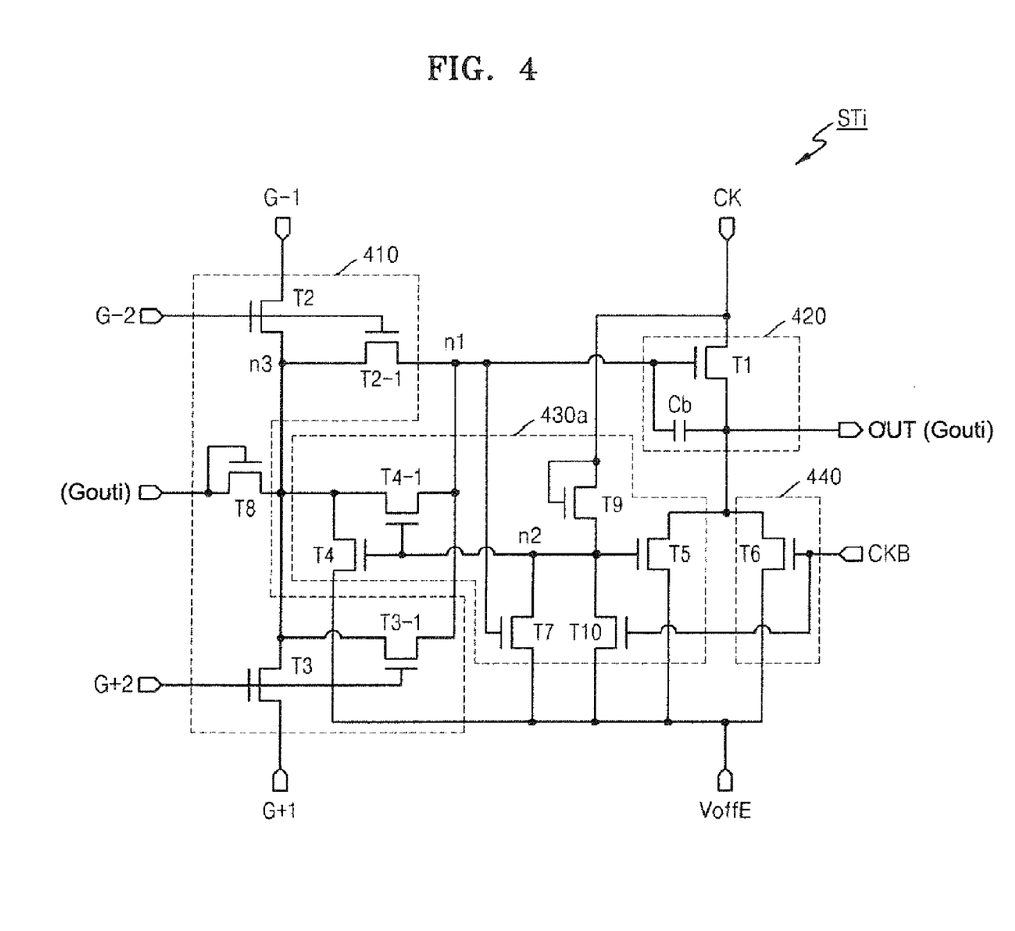
FIG. 4 is a circuit diagram illustrating a structure of an arbitrary stage of the shift register, according to an embodiment of the present invention.

FIG. 4 is a circuit diagram illustrating a structure of an arbitrary stage STi of the shift register 300, according to an embodiment of the present invention.

The shift register 300 according to embodiments of the present invention may be implemented using n-type transistors, p-type transistors, or Complementary Metal Oxide Semiconductor (CMOS) transistors. In the following description, it will be assumed that the shift register 300 is implemented using n-type transistors. However, the present invention is not limited to the embodiment where the shift register 300 is implemented using n-type transistors, and embodiments of the shift register 300 may be implemented using p-type transistors or CMOS transistors.

The stage STi of the shift register 300, according to the current embodiment of the present invention, includes a first node n1, a second node n2, a third node n3, an input circuit unit 410 which receives an output signal of a previous stage to output the output signal to the first node 1, a driving circuit unit 420 which generates an output signal Gouti according to a voltage of the first node n1, a holding unit 430a which holds the output signal Gouti at a level of the gate-off voltage Voff according to a voltage of the second node n2 during an inactive period of the corresponding stage, and a pull-down unit 440 which holds the output signal Gouti at the level of the gate-off voltage Voff during a period where a clock signal input to the inverted clock terminal CKB is active.

The input circuit unit 410 includes a second transistor T2, a first-second transistor T2-1, a third transistor T3, a first-third transistor T3-1, and an eighth transistor T8 operating as a second diode. The second transistor T2 includes a gate electrode connected to the first input terminal G−2, a first electrode connected to the second input terminal G−1, and a second electrode connected to the third node n3. The first-second transistor T2-1 includes a gate electrode connected to the first input terminal G−2, a first electrode connected to the third node n3, and a second electrode connected to the first node n1. The third transistor T3 includes a gate electrode connected to the fourth input terminal G+2, a first electrode connected to the third node n3, and a second electrode connected to the third input terminal G+1. The first-third transistor T3-1 includes a gate electrode connected to the fourth input terminal G+2, a first electrode connected to the third node n3, and a second electrode connected to the first node n1. The second diode (transistor T8) applies the output signal Gouti to the third node n3.

The driving circuit unit 420 according to an embodiment of the present invention includes a first transistor T1 and a boosting capacitor Cb. The first transistor T1 includes a gate electrode connected to the first node n1, a first electrode connected to the clock terminal CK, and a second electrode connected to the output terminal OUT. The boosting capacitor Cb is connected between the first node n1 and the output terminal OUT.

A holding unit 430a according to an embodiment of the present invention includes a ninth transistor T9 operating as a first diode, a fourth transistor T4, a first-fourth transistor T4-1, a fifth transistor T5, a seventh transistor T7, and a tenth transistor T10. The first diode (ninth transistor T9) is connected between the clock terminal CK and the second node n2 to apply a clock signal to the second node n2. As illustrated in FIG. 4, the first diode may be implemented with the ninth transistor T9 where a gate electrode and a first electrode are electrically short-circuited. The gate electrode and the first electrode are electrically short-circuited in the ninth transistor T9 so that the ninth transistor T9 operates as a diode. The fourth transistor T4 includes a gate electrode connected to the second node n2, a first electrode connected to the third node n3, and a second electrode connected to the off-voltage terminal VoffE. The first-fourth transistor T4-1 includes a gate electrode connected to the second node n2, a first electrode connected to the third node n3, and a second electrode connected to the first node n1. The fifth transistor T5 includes a gate electrode connected to the second node n2, a first electrode connected to the output terminal OUT, and a second electrode connected to the off-voltage terminal VoffE. The seventh transistor T7 includes a gate electrode connected to the first node n1, a first electrode connected to the second node n2, and a second electrode connected to the off-voltage terminal VoffE. The tenth transistor T10 includes a gate electrode connected to the inverted clock terminal CKB, a first electrode connected to the second node n2, and a second electrode connected to the off-voltage terminal VoffE.

The pull-down unit 440 includes a sixth transistor T6 which includes a gate electrode connected to the inverted clock terminal CKB, a first electrode connected to the output terminal OUT, and a second electrode connected to the off-voltage terminal VoffE.

Figure 5:
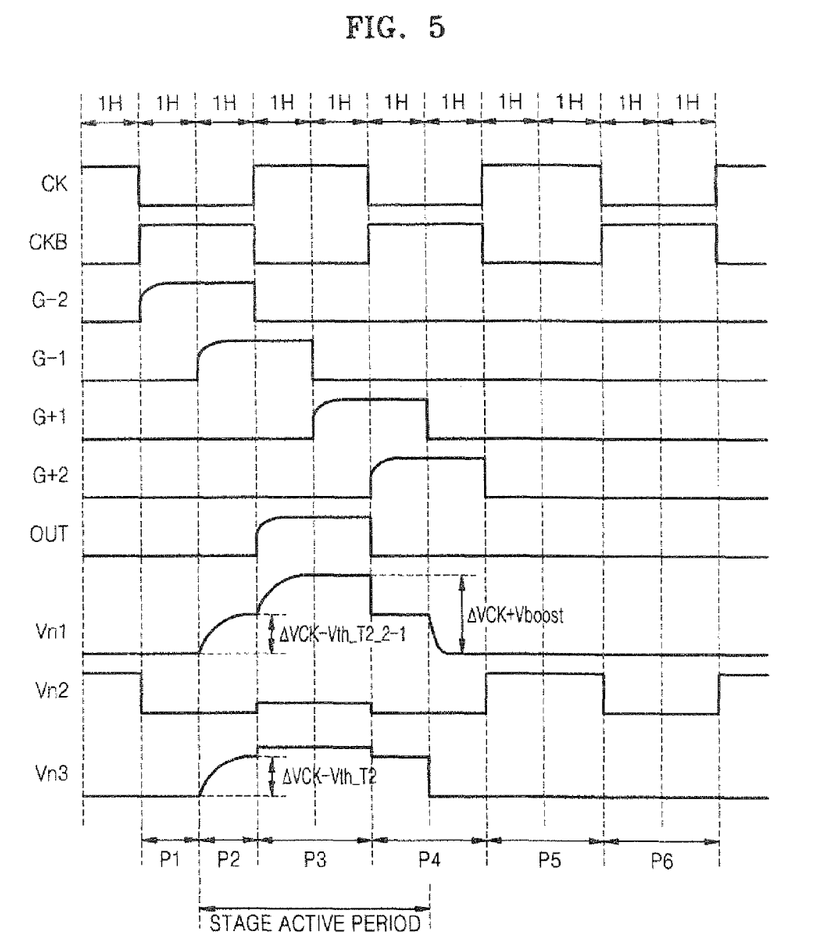
FIG. 5 is a timing diagram of operations of a shift register according to an embodiment of the present invention.

FIG. 5 is a timing diagram of operations of the shift register 300 according to an embodiment of the present invention. The operations of the stage STi illustrated in FIG. 4 will be described using the timing diagram of FIG. 5.

In FIG. 5, voltage levels of terminals and nodes in the stage STi are shown. Vn1 through Vn3 denote voltages of the first through third nodes n1 through n3, respectively. A signal input through the clock terminal CK will be referred to as a clock signal, and a signal input through the inverted clock terminal CKB will be referred to as an inverted clock signal.

In a period P1, the tenth transistor T10 is turned on by an inverted clock signal at a level of the gate-on voltage Von, such that the second node n2 has the gate-off voltage Voff. The first node n1 and the third node n3 have the gate-off voltage Voff, as the second transistor T2 and the first-second transistor T2-1 are turned on by the gate-on voltage Von of the first input terminal G−2 and thus the gate-off voltage Voff of the second input terminal G−1 is applied to the first node n1 and the third node n3. The output terminal OUT is pulled down, as the sixth transistor T6 is turned on by the gate-on voltage Von of the inverted clock terminal CKB and thus the gate-off voltage Voff of the off-voltage terminal VoffE is applied to the output terminal OUT.

In a period P2, the first node n1 is precharged. In the period P2, when the turn-on states of the second transistor T2 and the first-second transistor T2-1 are maintained, the second input terminal G−1 has the gate-on voltage Von, such that a voltage that dropped to that of a threshold voltage of the second transistor T2 and/or the first-second transistor T2-1 from the gate-on voltage Von is applied to the first node n1 and the third node n3. The first node n1 is precharged to a voltage level (ΔVCK-Vth_T2_2-1) calculated by subtracting a threshold voltage Vth_T2_2-1 of the second transistor T2 and the first-second transistor T2-1 from a swing width of the first clock signal CKL or the second clock signal CKR. A voltage level of the first node n1 gradually increases by the capacitance in the first node n1. The third node n3 is charged up to a voltage level (ΔVCK_Vth_T2) calculated by subtracting a threshold voltage Vth_T2 of the second transistor T2 from the swing width of the first clock signal CKL or the second clock signal CKR. The second node n2 is connected to the off-voltage terminal VoffE through the tenth transistor T10 and thus is held at the level of the gate-off voltage Voff. As the sixth transistor T6 is held in the turn-on state, the output terminal OUT is held at the level of the gate-off voltage Voff.

The third transistor T3, the first-third transistor T3-1, the fourth transistor T4, and the first-fourth transistor T4-1 are held in the turn-off state in the periods P1 and P2.

In a period P3, as the first input terminal Gn−2 has the gate-off voltage Voff, the second transistor T2 and the first-second transistor T2-1 are turned off.

In the period P3, a voltage of the second node n2 is determined by voltage distribution based on resistances of the ninth transistor T9 and the seventh transistor T7. As the seventh transistor T7 is turned on by a voltage of the first node n1 and the ninth transistor T9 is turned on by a clock signal having the gate-on voltage Von in the period P3, a current path is formed between the clock terminal CK and the off-voltage terminal VoffE and the voltage of the second node n2 is determined by voltage distribution of the ninth transistor T9 and the seventh transistor T7. The voltage of the second node n2 during the period P3 may be determined such that the fourth transistor T4, the first-fourth transistor T4-1, and the fifth transistor T5 are held in the turn-off state during the period P3.

With the voltage of the second node n2, the fourth transistor T4 and the first-fourth transistor T4-1 are held in the turn-off state during the period P3. The third transistor T3 and the first-third transistor T3-1 are held in the turn-off state as a fourth input terminal Gn+2 has the gate-off voltage Voff. As the second transistor T2, the first-second transistor T2-1, the third transistor T3, the first-third transistor T3-1, the fourth transistor T4, and the first-fourth transistor T4-1 are all held in the turn-off state, the first node n1 enters a floating state. The first transistor T1 is turned on by the voltage of the first node n1, and the output terminal OUT is pulled up by being provided with the voltage of the clock terminal CK having the gate-on voltage Von. The first node n1 is boosted with the voltage of the output terminal OUT to a voltage (ΔVCK+Vboost) through the boosting capacitor Cb, thereby maintaining a gate-source voltage Vgs to allow the first transistor T1 to operate in a saturation region. Herein, Vboost is a boosting voltage of the boosting capacitor Cb and is determined as follows:

$$Vboost=(Cb/(\text{capacitance in first node}+Cb))*VOUT \quad (1),$$

wherein VOUT denotes a voltage variation of the output terminal OUT.

As the voltage of the first node n1 is boosted through the boosting capacitor Cb, the voltage of the output terminal OUT can fully swing. At this time, the voltage of the first node n1 can maintain the boosted stage when the first node n1 maintains a high-impedance state.

Embodiments of the present invention prevent a voltage from dropping by the generation of a leakage current in the high-impedance state of the first node n1. According to embodiments of the present invention, the third node n3 is held at the same level as the output signal Gouti having the gate-on voltage Von during the period P3, such that the gate-source voltage (Vgs) of the first-second transistor T2-1, the first-third transistor T3-1, and the first-fourth transistor T4-1 decrease to negative values. Thus, in the period P3, a leakage current generated through the first-second transistor T2-1, the first-third transistor T3-1, and the first-fourth transistor T4-1 can be reduced by a large amount. Hereinafter, the leakage current reduction effect will be described in more detail with reference to FIG. 6.

Figure 6:
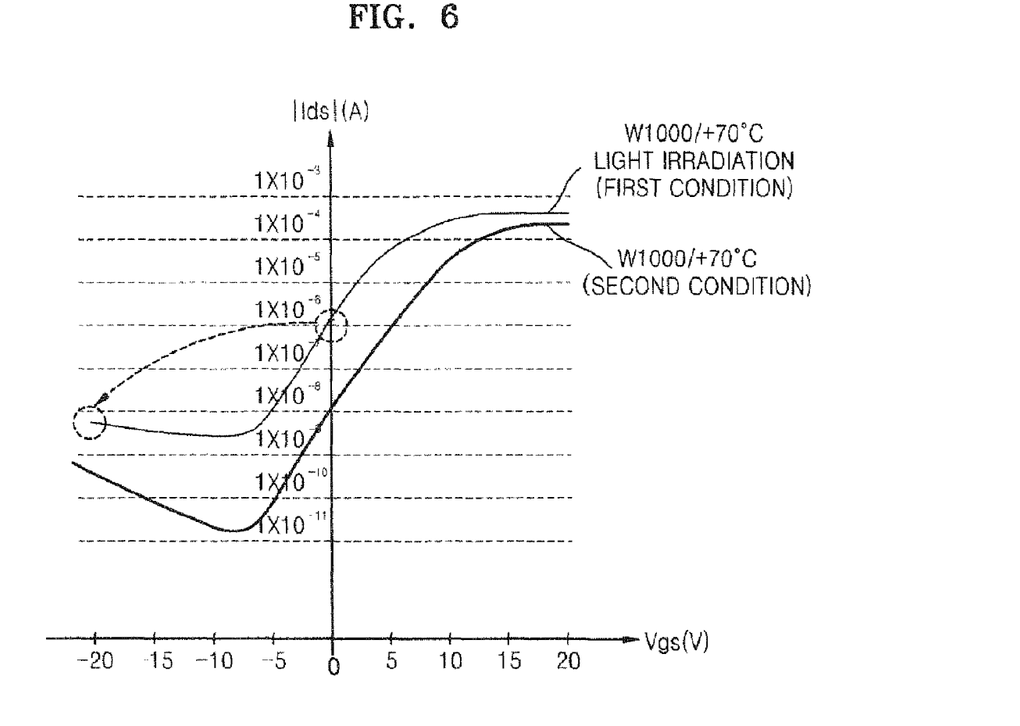
FIG. 6 is a graph showing a current-voltage characteristic of a transistor formed of amorphous silicon.

FIG. 6 is a graph showing a current-voltage characteristic of a transistor formed of amorphous silicon.

The shift register 300 according to embodiments of the present invention may be formed of amorphous silicon. A Thin Film Transistor (TFT) formed of amorphous silicon has a large deviation in characteristics of transistors in the circuit according to process and use environment. In a high-temperature state, a Gate Block Defect (GBD) may be generated and especially, at Vgs=0V where transistors in the circuit are in the turn-off state, characteristic dispersion between lots exists and thus the leakage current may be generated in the turn-off state. When the condition of light irradiation from backlight is added to the high-temperature condition, the leakage current increases further in the condition of Vgs=0V. As a result, in the shift register 300 formed of amorphous silicon, the leakage current is generated in the condition of Vgs=0 V, such that the high-impedance state is not maintained. In particular, in the case of the shift register 300 using the boosting capacitor Cb, when an electrode of the boosting capacitor Cb is floated in the high-impedance state, the voltage of the floated node may not be boosted well due to the leakage current.

Such a defect is usually generated in an initial state (within 10 hours after insertion into a chamber) in a high-temperature operation experiment. To control the defect, a fabrication (FAB) process is set up and an initial current-voltage characteristic of a transistor is controlled, but this approach may act as a limiting factor to a process margin.

FIG. 6 is a graph showing a current-voltage characteristic of a transistor formed of amorphous silicon under light irradiation (first condition) and in the absence of light irradiation (second condition) when characteristic dispersion of the transistor between lots exists, a channel width W of the transistor is 1000 nm, and the temperature is high, i.e., 70° C. As can be seen from FIG. 6, under light irradiation, when compared to the absence of light irradiation, the leakage current increases in the condition of Vgs=0 V.

According to embodiments of the present invention, referring again to FIGS. 4 and 5, the voltage of the third node n3 is held at a level of an output signal having the gate-on voltage Von during an active period of a stage, such that the gate-source voltage Vgs of the first-second transistor T2-1, the first-third transistor T3-1, and the first-fourth transistor T4-1 have negative values, thereby reducing the leakage current by a large amount during the high-impedance state of the first node n1. For example, when the gate-off voltage Voff is −10 V together with a gate-on voltage Von of 15 V and a threshold voltage Vth_T2 of 3 V, the gate-source voltage Vgs of the first-second transistor T2-1 is Vgs=Voff−(Von−Vth_T2)=−10 V−(15 V−3 V)=−22 V, such that the operating point of the first-second transistor T2-1 moves as illustrated in FIG. 6, resulting in a leakage current reduction by 1/100 or more from Vgs=0 V in light irradiation. Likewise, the gate-source voltage Vgs of the first-third transistor T3-1 and the first-fourth transistor T4-1 also decrease, resulting in a leakage current reduction by 1/100 or more in the high-impedance state. Thus, according to embodiments of the present invention, the first node n1 can maintain a normal voltage in the high-impedance state in spite of changes in characteristic dispersion among panels and environment, allowing stable gate driving.

In a period P4, the inverted clock signal becomes at the level of the gate-on voltage Von, thus turning on the sixth transistor T6, and the gate-off voltage Voff of the off-voltage terminal VoffE is applied to the output terminal OUT through the sixth transistor T6, thus pulling down the output signal Gouti. The tenth transistor T10 is turned on by the inverted clock signal, and the ninth transistor T9 is turned off by the clock signal having the gate-off voltage Voff, such that the voltage of the second node n2 is pulled down. The voltage of the first node n1 is pulled down as a voltage of the third input terminal G+1, that is, a voltage of an output signal of a next stage decreases to the level of the gate-off voltage Voff.

In a period P5, as the inverted clock signal has the gate-off voltage Voff and the clock signal has the gate-on voltage Von, the clock signal is provided to the second node n2 through the ninth transistor T9 and thus the second node n2 has the gate-on voltage Von. As the second node n2 has the gate-on voltage Von, the fourth transistor T4 and the first-fourth transistor T4-1 are turned on, thus pulling down the first node n1 in the inactive period of the stage STi. As the second node n2 has the gate-on voltage Von, the fifth transistor T5 is turned on, thus pulling down the output signal Gouti in the inactive period of the stage STi.

According to embodiments of the present invention, when the clock signal has the gate-on voltage Von through the diode-connected ninth transistor T9 in the inactive period of the stage STi, the voltage of the second node n2 is held at the level of the gate-on voltage Von. The voltage level of the second node n2 may fluctuate during driving of the shift register 300 due to generation of a leakage current through the seventh transistor T7 and coupling with neighboring wiring. For example, if wiring for the common electrode or data line of which voltage level swings runs around the first node n1, the voltage of the first node n1 fluctuates due to coupling with neighboring wiring, causing generation of a leakage current in the period P5 through the seventh transistor T7. In this case, due to the generated leakage current, the voltage level of the second node n2 deviates from the level of the gate-on voltage Von, such that the fifth transistor T5 may not be completely turned on or the output signal Gouti may not be completely pulled down. If the output signal Gouti is not completely pulled down, a ripple is generated in the output signal Gouti during the inactive period, failing to achieve a stable output of the shift register 300. According to embodiments of the present invention, by using a diode such as the ninth transistor T9, a current is stably provided to the second node n2 to stably maintain the voltage of the second node n2, such that a ripple in the output signal Gouti can be effectively removed during the active inactive period of the clock signal at the stage STi.

In a period P6, the sixth transistor T6 is turned on by the inverted clock signal, thus applying the gate-off voltage Voff of the off-voltage terminal VoffE to the output signal. Hence, the ripple in the output signal can be effectively removed in the inactive period of the clock signal during the inactive period of the stage STi.

Thereafter, the periods P5 and P6 are repeated until the period P1 starts.

Figure 7:
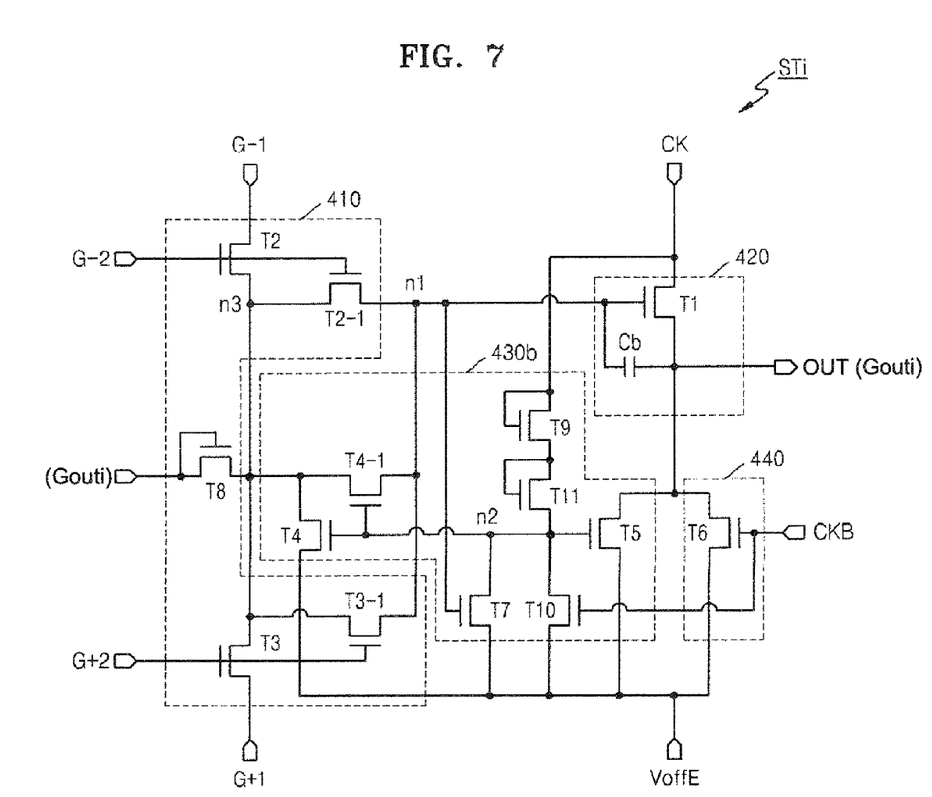
FIG. 7 is a circuit diagram illustrating a structure of an arbitrary stage of a shift register, according to another embodiment of the present invention.

FIG. 7 is a circuit diagram illustrating a structure of the arbitrary stage STi' of the shift register 300, according to another embodiment of the present invention.

According to another embodiment of the present invention, the arbitrary stage STi' differs slightly from the arbitrary stage STi of FIG. 4, wherein a holding unit 430b differs from the holding unit 430a of FIG. 4, in that a plurality of diodes are serially connected between the clock terminal CK and the second node n2 to apply the clock signal to the second node n2.

For example, as illustrated in FIG. 7, the diode-connected ninth transistor T9 and a diode-connected eleventh transistor T11 may be serially connected between the clock terminal CK and the second node n2. The serial diode connection may be implemented by disposing the plurality of diodes or a plurality of diode-connected transistors. As another example, the serial diode connection may be implemented by increasing a channel length of the diode-connected transistor or reducing a channel width of the diode-connected transistor, such that a resistance between the clock terminal CK and the second node n2 is increased when the clock signal has the gate-on voltage Von.

Figure 8:
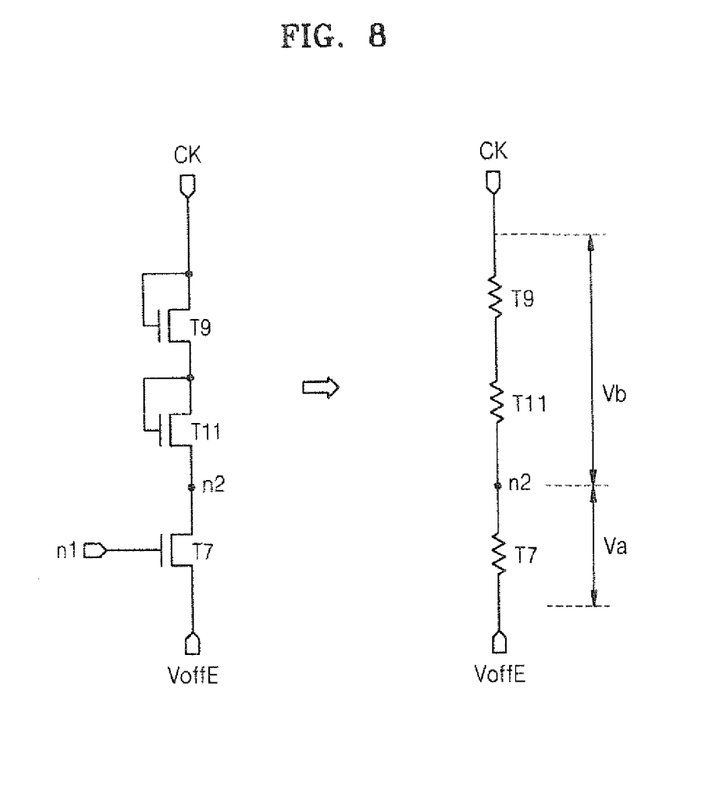
FIG. 8 is a circuit diagram illustrating a part of an arbitrary stage of a shift register according to another embodiment of the present invention.

FIG. 8 is a circuit diagram illustrating a part of the arbitrary stage STi' of the shift register 300 according to another embodiment of the present invention. The right side in FIG. 8 shows an equivalent circuit of the left side in the period P3.

As described above with reference to FIG. 5, the voltage level of the second node n2 in the period P3 is determined by voltage distribution based on resistances of the ninth transistor T9 and the seventh transistor T7 between the clock terminal CK and the off-voltage terminal VoffE. When the voltage of the second node n2 increases due to the resistance of the seventh transistor T7 in the period P3, a leakage current is generated through the fifth transistor T5, thus lowering the level of the output signal Gouti in the period P3. According to the embodiment of the present invention illustrated in FIG. 8, a plurality of diodes, that is, the ninth transistor T9 and the eleventh transistor T11, are disposed between the clock terminal CK and the second node n2 to lower a voltage level Va of the seventh transistor T7, thereby reducing the leakage current generated through the fifth transistor T5 and increasing the level of the output signal in the period P3.

Figure 9A:
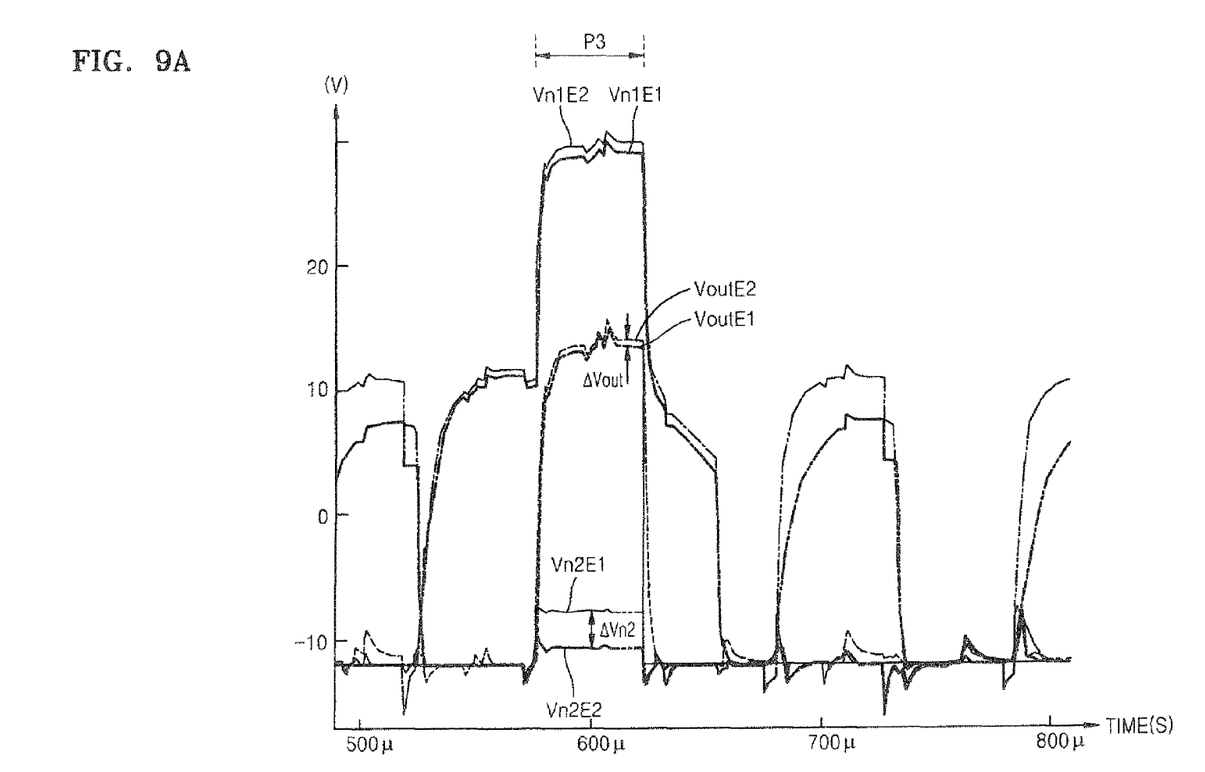
FIGS. 9A and 9B are graphs of experiment examples showing voltage levels of a first node and a second node and a voltage level of an output signal, in driving according to another embodiment of the present invention.
Figure 9B:
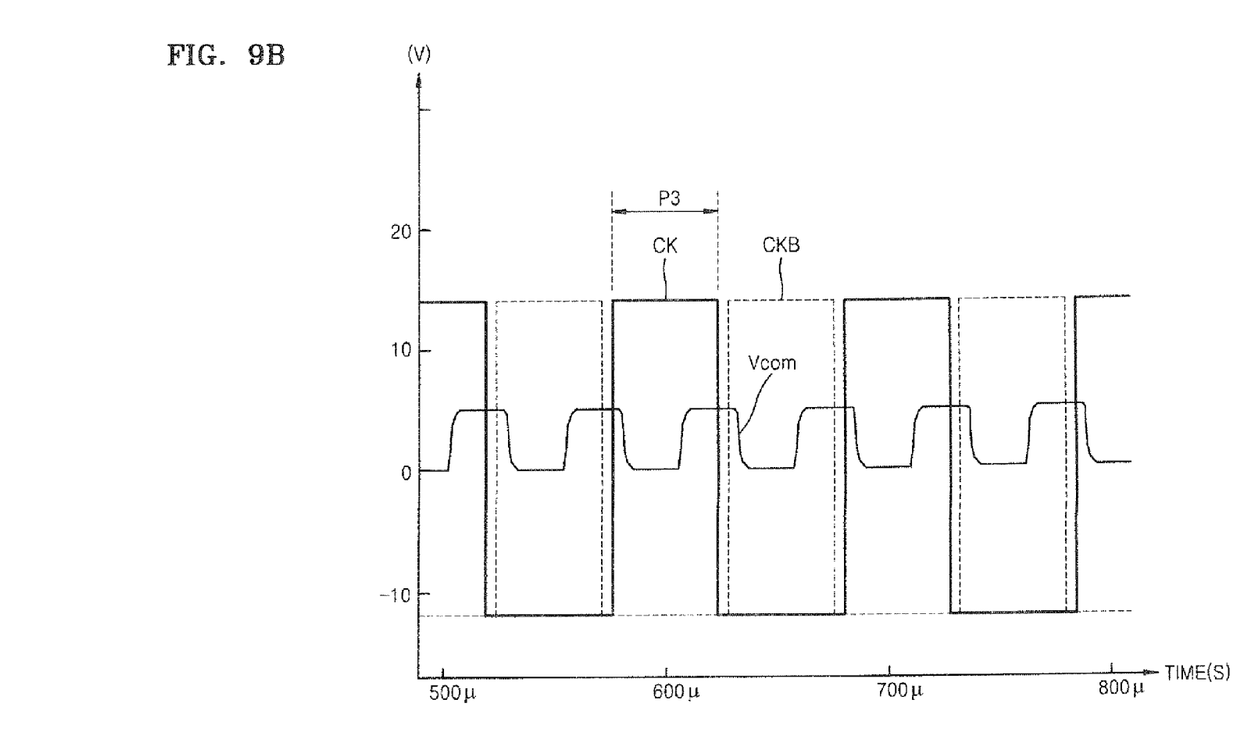

FIGS. 9A and 9B are graphs of an experiment example showing the voltage levels of the first node n1 and the second node n2 and the voltage level of the output signal, in driving according to the present invention.

The experiment example shown in FIGS. 9A and 9B is where the clock signal CK and the inverted clock signal CKB are input and the common voltage Vcom swings as illustrated in FIG. 9B. In FIG. 9A, Vn1E1 denotes the voltage of the first node n1 according to the embodiment shown in FIG. 4, Vn2E1 denotes the voltage of the second node n2 according to the embodiment shown in FIG. 4, VoutE1 denotes the voltage of the output signal Gouti according to the embodiment shown in FIG. 4, Vn1E2 denotes the voltage of the first node n1 according to the embodiment shown in FIG. 7, Vn2E2 denotes the voltage of the second node n2 according to the embodiment shown in FIG. 7, and VoutE2 denotes the voltage of the output signal Gouti according to the embodiment shown in FIG. 7.

It can be seen in FIG. 9A that the voltage level Vn2E2 of the second node n2 in the embodiment shown in FIG. 7 is lower than the voltage level Vn2E1 of the second node n2 in the embodiment shown in FIG. 4 in the period P3 where the output signal Gouti is active. For example, as can be observed in the experiment example shown in FIGS. 9A and 9B, in the embodiment shown in FIG. 7, when compared to the embodiment shown in FIG. 4, the voltage Vn2E2 of the second node n2 is reduced by about 3 V (ΔVn2) and the voltage VoutE2 of output signal Gouti is increased by 0.46 V (ΔVout).

As can be anticipated from the foregoing description, according to the embodiments of the present invention, by supplying a current to the second node through a diode, the voltage of the second node is stably maintained such that the ripple of the gate driving signal can be effectively removed.

While the present invention has been particularly shown and described with reference to embodiments thereof, it will be understood by one of ordinary skill in the art that various changes in form and detail may be made therein without departing from the spirit and scope of the present invention as defined by the following claims. Accordingly, the disclosed embodiments should be considered in a descriptive sense and not in a restrictive sense. The scope of the present invention will be defined by the appended claims, and differences in scope equivalent to the appended claims should be construed as being included in the present invention. Terminology used in the claims corresponds to terminology used in the specification.

What is claimed is:

1. A shift register with a plurality of stages, each of which comprises a first node, a second node, and a third node being in a high-impedance state when the first node is in a high-impedance state,
the shift register comprising:
an input circuit unit inputting a driving voltage to the first node in response to an output signal of a previous stage;
a driving circuit unit generating an output signal according to a voltage of the first node; and
a holding unit holding the output signal at a level of a gate-off voltage according to a voltage of the second node in an inactive period of a current stage,
the holding unit comprising a first diode preventing leakage current from the second node due to fluctuation of voltage at the first node by applying a clock signal having a gate-on voltage directly to the second node in the inactive period of the current stage;
each of the plurality of stages comprises a clock terminal to which the clock signal is input, an inverted clock terminal to which an inverted clock signal of the clock signal is input, and an off-voltage terminal to which the gate-off voltage is input;
the holding unit comprises a tenth transistor, the tenth transistor comprising a gate electrode connected to the inverted clock terminal, a first electrode connected to the second node, and a second electrode connected to the off-voltage terminal;
the input circuit unit comprises:
a second transistor comprising a gate electrode connected to an output terminal of a first previous stage, a first electrode connected to an output terminal of a second previous stage, and a second electrode connected to the third node;
a first-second transistor comprising a gate electrode connected to the output terminal of the first previous stage, a first electrode connected to the third node, and a second electrode connected to the first node;
a second diode applying the output signal of the current stage to the third node;
a third transistor comprising a gate electrode connected to an output terminal of a second next stage, a first electrode connected to the third node, and a second electrode connected to an output terminal of a first next stage; and
a first-third transistor comprising a gate electrode connected to the output terminal of the second next stage, a first electrode connected to the third node, and a second electrode connected to the first node.

2. The shift register of claim 1, wherein each of the plurality of stages further comprises a pull down unit which holds the output signal at the level of the gate-off voltage in a period where the inverted clock signal is active.

3. The shift register of claim 1, wherein the pull down unit comprises a sixth transistor comprising a gate electrode connected to the inverted clock terminal, a first electrode connected to the output terminal, and a second electrode connected to the off-voltage terminal.

4. The shift register of claim 1, wherein the driving circuit unit comprises:
a first transistor comprising a gate electrode connected to the first node, a first electrode connected to the clock terminal, and a second electrode connected to the output terminal; and
a boosting capacitor connected between the first node and the output terminal.

5. The shift register of claim 1, wherein the holding unit further comprises at least one second diode which is serially connected with the first diode between the clock terminal and the second node.

6. The shift register of claim 1, wherein the shift register is driven using first and second clock signals, and first and second inverted clock signals, and
(4a+1)th stages comprise the clock terminal to which the first clock signal is input and the inverted clock terminal to which the first inverted clock signal is input, in which a is an integer greater than or equal to 0 and less than n/4;
(4a+2)th stages comprise the clock terminal to which the second clock signal is input and the inverted clock terminal to which the second inverted clock signal is input;
(4a+3)th stages comprise the clock terminal to which the first inverted clock signal is input and the inverted clock terminal to which the first clock signal is input; and
(4a+4)th stages comprise the clock terminal to which the second inverted clock signal is input and the inverted clock terminal to which the second clock signal is input.

7. The shift register of claim 1, further comprising a plurality of transistors connected between the first node and the third node, the third node being applied the output signal during an active period to maintain the voltage of the first node by reducing a leakage current of the plurality of transistors by providing a negative Vgs bias for a plurality of transistors connected between the first node and the third node.

8. The shift register of claim 1, wherein the driving circuit unit includes a driving transistor connected between a clock terminal having the same clock signal as applied to the second node.

9. The shift register of claim 1, wherein the holding unit comprises a pull down transistor connected between an output terminal having the output signal and an off-voltage terminal, the second node being connected to a gate of the pull down transistor.

10. A display apparatus comprising:
a plurality of pixels disposed at intersecting portions between data lines and gate lines;
a gate driving unit outputting gate driving signals to the plurality of pixels, respectively, through the gate lines; and
a data driving unit generating a data signal corresponding to an input image and outputting the data signal to the plurality of pixels, respectively, through the data lines,
the gate driving unit comprises a shift register comprising a plurality of stages which generate and output the gate driving signal, each of the plurality of stages comprising a first node, a second node, and a third node being in a high-impedance state when the first node is in a high-impedance state,
the shift register comprising:
an input circuit unit inputting a driving voltage to the first node in response to an output signal of a previous stage;

a driving circuit unit generating an output signal according to a voltage of the first node; and
a holding unit holding the output signal at a level of a gate-off voltage according to a voltage of the second node in an inactive period of a current stage,
the holding unit comprising a first diode preventing leakage current from the second node due to fluctuation of voltage at the first node by applying a clock signal having a gate-on voltage directly to the second node in the inactive period of the current stage;
each of the plurality of stages comprises a clock terminal to which the clock signal is input, an inverted clock terminal to which an inverted clock signal of the clock signal is input, and an off-voltage terminal to which the gate-off voltage is input, and
the holding unit comprises a tenth transistor, the tenth transistor comprising a gate electrode connected to the inverted clock terminal, a first electrode connected to the second node, and a second electrode connected to the off-voltage terminal;
the input circuit unit comprises:
a second transistor comprising a gate electrode connected to an output terminal of a first previous stage, a first electrode connected to an output terminal of a second previous stage, and a second electrode connected to the third node;
a first-second transistor comprising a gate electrode connected to the output terminal of the first previous stage, a first electrode connected to the third node, and a second electrode connected to the first node;
a second diode applying the output signal of the current stage to the third node;
a third transistor comprising a gate electrode connected to an output terminal of a second next stage, a first electrode connected to the third node, and a second electrode connected to an output terminal of a first next stage; and
a first-third transistor comprising a gate electrode connected to the output terminal of the second next stage, a first electrode connected to the third node and a second electrode connected to the first node.

11. The display apparatus of claim 10, wherein:
each of the plurality of stages comprises an output terminal which outputs the output signal, and
the holding unit comprises:
a fifth transistor comprising a gate electrode connected to the second node, a first electrode connected to the output terminal, and a second electrode connected to the off-voltage terminal;
a fourth transistor comprising a gate electrode connected to the second node, a first electrode connected to the third node, and a second electrode connected to the off-voltage terminal; and
a seventh transistor comprising a gate electrode connected to the first node, a first electrode connected to the second node, and a second electrode connected to the off-voltage terminal.

12. The display apparatus of claim 11, wherein the holding unit further comprises a first-fourth transistor comprising a gate electrode connected to the second node, a first electrode connected to the third node, and a second electrode connected to the first node.

13. The display apparatus of claim 10, wherein the driving circuit unit comprises:

a first transistor comprising a gate electrode connected to the first node, a first electrode connected to the clock terminal, and a second electrode connected to the output terminal; and a boosting capacitor connected between the first node and the output terminal.

14. The display apparatus of claim 10, wherein the first previous stage is a stage preceding the current stage by two stages, the second previous stage is a stage preceding the current stage by one stage, the first next stage is a stage following the current stage after one stage, and the second next stage is a stage following the current stage after two stages.

15. The display apparatus of claim 10, wherein the holding unit further comprises at least one second diode which is serially connected with the first diode between the clock terminal and the second node.

16. The display apparatus of claim 10, wherein the shift register is driven using first and second clock signals, and first and second inverted clock signals, and
(4a+1)th stages comprise the clock terminal to which the first clock signal is input and the inverted clock terminal to which the first inverted clock signal is input, in which a is an integer greater than or equal to 0 and less than n/4;
(4a+2)th stages comprise the clock terminal to which the second clock signal is input and the inverted clock terminal to which the second inverted clock signal is input;
(4a+3)th stages comprise the clock terminal to which the first inverted clock signal is input and the inverted clock terminal to which the first clock signal is input; and
(4a+4)th stages comprise the clock terminal to which the second inverted clock signal is input and the inverted clock terminal to which the second clock signal is input.

17. The display apparatus of claim 10, further comprising a plurality of transistors connected between the first node and the third node, the third node being applied the output signal during an active period to maintain the voltage at the first node by reducing a leakage current between the first node and the third node by providing a negative Vgs for the plurality of transistors connected between the first node and the third node.

18. The display apparatus of claim 10, wherein the driving circuit unit includes a driving transistor connected between a clock terminal having the same clock signal as applied to the second node.

19. The display apparatus of claim 10, wherein the holding unit comprises a pull down transistor connected between an output terminal having the output signal and an off-voltage terminal, the second node being connected to a gate of the pull down transistor.

20. A shift register comprising a plurality of stages, each of which comprises a first node, a second node, and a third node, each shift register comprising:
an input circuit unit inputting a driving voltage to the first node in response to an output signal of a previous stage;
a driving circuit unit generating an output signal according to a voltage of the first node; and
a holding unit holding the output signal at a level of a gate-off voltage according to a voltage of the second node in an inactive period of a current stage,
the input circuit includes a second diode to apply the output signal to the third node to prevent a leakage current from the first node by maintaining the third node in a high impedance state when the first node is in a high-impedance state in an active period of the current stage,
each of the plurality of stages comprises a clock terminal to which the clock signal is input, an inverted clock terminal to which an inverted clock signal of the clock signal is input, and an off-voltage terminal to which the gate-off voltage is input, and
the holding unit comprises a tenth transistor, the tenth transistor comprising a gate electrode connected to the inverted clock terminal, a first electrode connected to the second node, and a second electrode connected to the off-voltage terminal,
the input circuit unit comprises:
a second transistor comprising a gate electrode connected to an output terminal of a first previous stage, a first electrode connected to an output terminal of a second previous stage, and a second electrode connected to the third node;
a first-second transistor comprising a gate electrode connected to the output terminal of the first previous stage, a first electrode connected to the third node, and a second electrode connected to the first node;
a second diode applying the output signal of the current stage to the third node;
a third transistor comprising a gate electrode connected to an output terminal of a second next stage, a first electrode connected to the third node, and a second electrode connected to an output terminal of a first next stage; and
a first-third transistor comprising a gate electrode connected to the output terminal of the second next stage, a first electrode connected to the third node, and a second electrode connected to the first node.

21. The shift register of claim 20, wherein the output signal being applied to the third node during an active period to maintain the voltage of the first node by reducing a leakage current of at least one transistor connected between the first node and the third node.

* * * * *